United States Patent
Endres et al.

(10) Patent No.: US 8,937,708 B2
(45) Date of Patent: Jan. 20, 2015

(54) ILLUMINATION OPTICS FOR MICROLITHOGRAPHY

(75) Inventors: Martin Endres, Koenigsbronn (DE); Ralf Stuetzle, Aalen (DE); Jens Ossmann, Aalen (DE)

(73) Assignee: Carl Zeiss SMT GmbH, Oberkochen (DE)

(*) Notice: Subject to any disclaimer, the term of this patent is extended or adjusted under 35 U.S.C. 154(b) by 1070 days.

(21) Appl. No.: 12/789,772

(22) Filed: May 28, 2010

(65) Prior Publication Data

US 2010/0253926 A1 Oct. 7, 2010

Related U.S. Application Data

(63) Continuation of application No. PCT/EP2008/009786, filed on Nov. 20, 2008.

(60) Provisional application No. 61/012,812, filed on Dec. 11, 2007.

(30) Foreign Application Priority Data

Mar. 7, 2008 (DE) .......................... 10 2008 013 229

(51) Int. Cl.
*G03B 27/54* (2006.01)
*G03B 27/72* (2006.01)
*G03F 7/20* (2006.01)

(52) U.S. Cl.
CPC ............ *G03F 7/702* (2013.01); *G03F 7/70075* (2013.01); *G03F 7/70083* (2013.01); *G03F 7/70191* (2013.01)
USPC .............................................. 355/67; 355/71

(58) Field of Classification Search
CPC ............ G03F 7/70075; G03F 7/70191; G03F 7/70083; G03F 7/702
USPC ............. 355/52, 53, 55, 67–71; 359/378–379
See application file for complete search history.

(56) References Cited

U.S. PATENT DOCUMENTS 6,013,401 A 1/2000 McCullough et al.
6,198,793 B1 3/2001 Schultz et al.
(Continued)

FOREIGN PATENT DOCUMENTS

CN 1 650 234 A 8/2005
DE 100 53 587 5/2002
(Continued)

OTHER PUBLICATIONS

Zhang et al., "Illumination Pupil Fill Measurement and Analysis and Its Application in Scanner V-H Bias Characterization for 130nm Node and Beyond," SPIE, Optical Microlithography, vol. 5040, 2003, pp. 45-56.
(Continued)

*Primary Examiner* — Hung Henry Nguyen
(74) *Attorney, Agent, or Firm* — Fish & Richardson P.C.

(57) ABSTRACT

An illumination optics for microlithography includes an optical assembly for guiding illumination light to an object field to be illuminated in an object plane. The illumination optics can divide an illumination light radiation bundle into a plurality of radiation sub-bundles which are assigned to different illumination angles of the object field illumination. The illumination optics is configured so that at least some of the radiation sub-bundles are superimposed in a superposition plane which is spaced from the object plane and which is not imaged into the object plane in which superposition takes place. This superposition is such that edges of the superimposed radiation sub-bundles coincide at least partially. In some embodiments, a field intensity setting device includes a plurality of adjacent individual diaphragms which at least attenuate illumination light when exposed thereon. These individual diaphragms are insertable into an illumination light radiation bundle in a direction parallel to an object displacement direction. All individual diaphragms of the field intensity setting device are insertable into the illumination light radiation bundle from one and the same side.

30 Claims, 7 Drawing Sheets

(56) References Cited

U.S. PATENT DOCUMENTS

| | | | |
|---|---|---|---|
| 6,476,905 B1* | 11/2002 | Li | 355/71 |
| 6,658,084 B2 | 12/2003 | Singer | |
| 6,771,352 B2* | 8/2004 | Dierichs | 355/67 |
| 7,030,958 B2 | 4/2006 | Luijkx et al. | |
| 7,088,527 B2* | 8/2006 | Wiener | 359/738 |
| 7,170,587 B2* | 1/2007 | Dierichs et al. | 355/71 |
| 7,196,841 B2* | 3/2007 | Melzer et al. | 359/351 |
| 2002/0048007 A1* | 4/2002 | Tsuji et al. | 355/66 |
| 2006/0103828 A1* | 5/2006 | David | 355/67 |
| 2006/0244941 A1 | 11/2006 | Gruner et al. | |
| 2009/0135394 A1 | 5/2009 | Van Greevenbroek | 355/67 |

FOREIGN PATENT DOCUMENTS

| | | | |
|---|---|---|---|
| EP | 1 291 721 | 3/2003 | |
| EP | 1 491 959 | 12/2004 | |
| EP | 1 555 373 A2 | 7/2005 | |
| JP | 2002-110529 | 4/2002 | |
| JP | 2009-147321 | 7/2009 | G03F 7/20 |
| TW | 2006/25029 A | 7/2006 | |
| WO | WO 03/093902 | 11/2003 | |
| WO | WO 2005/040927 | 5/2005 | |

OTHER PUBLICATIONS

German Examination Report for Appl No. 10 2008 013 229.2, dated Jul. 21, 2008 (with English translation).

Notice of Grounds for Rejection, Japanese Patent Application No. 2010-537272, English Translation, 5 pages, Jun. 12, 2013.

Japanese office action, with English translation thereof, for corresponding JP Appl No. 2010-537272, dated Nov. 20, 2013.

Chinese office action with English translation with respect to Chinese patent application No. 2008 8012 0429.7, dated Jul. 20, 2011.

Japanese office action with English translation with respect to Japanese patent application No. 2010-537 272, dated Nov. 29, 2012.

European office action with respect to European patent application No. 08 859 710.9, dated Nov. 17, 2010.

European office action with respect to European patent application No. 08 859 710.9, dated Oct. 15, 2013.

European office action with respect to European patent application No. 08 859 710.9, dated Jan. 25, 2012.

Taiwanese office action and search report, with English translation thereof, for TW Appl No. 97 147 987, dated Apr. 8, 2014.

* cited by examiner

ILLUMINATION OPTICS FOR MICROLITHOGRAPHY

CROSS-REFERENCE TO RELATED APPLICATIONS

This application is a continuation of, and claims benefit under 35 USC 120 to, international application PCT/EP2008/009786, filed Nov. 20, 2008, which claims benefit of German Application No. 10 2008 013 229.2, filed Mar. 7, 2008 and U.S. Ser. No. 61/012,812, filed Dec. 11, 2007. International application PCT/EP2008/009786 is hereby incorporated by reference in its entirety.

FIELD

The disclosure relates to an illumination optics for microlithography. The disclosure further relates to an illumination system including an illumination optics of this type, a projection exposure apparatus including an illumination system of this type, a method of producing structured components, and a structured component produced according to a method of this type.

SUMMARY

The disclosure provides an illumination optics for microlithography configured so that it is possible to influence and/or monitor an illumination intensity distribution across the object field such that an illumination angle distribution is affected to the least possible extent while simultaneously ensuring that a size of the illumination optics is as small as possible.

In some embodiments, an illumination optics for microlithography includes:
  an optical assembly for guiding illumination light to an object field to be illuminated in an object plane;
  wherein the illumination optics divides an illumination light radiation bundle into a plurality of radiation sub-bundles which are assigned to different illumination angles of the object field illumination;
wherein the illumination optics is configured in such a way that at least some of the radiation sub-bundles are superimposed in a superposition plane, which is spaced from the object plane and which is not imaged into the object plane in which superposition takes place, in such a way that edges of the superimposed radiation sub-bundles coincide at least partially.

According to the disclosure, the object plane is spatially separated from the superposition plane of the radiation sub-bundles of the illumination light. The object plane and the superposition plane do not constitute planes that are imaged into one another; the object plane may therefore be arranged directly next to the superposition plane. No optical components are required between the object plane and the superposition plane for guiding the illumination light. In the superposition plane, a device may be arranged for setting an illumination intensity distribution across the object field or for monitoring the illumination intensity distribution across the object field via a sensor, for example.

This arrangement is such that the device interacts with the illumination light at the point of coinciding superposition of the radiation sub-bundles in such a way that all superimposed radiation sub-bundles, in other words the radiation sub-bundles from several or from all illumination angles, are detectable at the same time. As desired, the illumination light is therefore detectable in a superposition plane which is separated from the object plane. The illumination optics according to the disclosure can, but need not necessarily, include a facet mirror. It is conceivable as well to use a honeycomb condenser, for example, i.e. a transmissive optical element which is divided into a plurality of individual channels, and/or at least one diffractive element for dividing the illumination light radiation bundle into the radiation sub-bundles. According to the disclosure, a partial superposition, in other words a coinciding superposition, of sub-bundle edge portions of the radiation sub-bundles is sufficient. The remaining sub-bundle edge portions of the superimposed radiation sub-bundles need not coincide; in these portions, aberrations are tolerable. In the case of approximately rectangular radiation sub-bundles, for example, a superposition at one of the four sub-bundle edges is sufficient. At the point of superposition of the radiation sub-bundles in the superposition plane, it is possible, for example, to decouple radiation for an illumination-angle-independent additional sensor system which is then able to provide valuable, illumination-angle-independent information about the object field illumination. The coinciding edge portions of the superimposed radiation sub-bundles form a common sub-bundle edge portion which is usually perpendicular to an object displacement direction of an object that is displaced during the microlithographic projection process. A displacement of this type takes place in a projection exposure apparatus designed as a scanner. Via the inventive illumination optics, the radiation sub-bundles are superimposed in the superposition plane.

In certain embodiments, the disclosure provides an illumination optics for microlithography that includes:
  an optical assembly for guiding illumination light to an object field to be illuminated in an object plane;
  wherein the illumination optics includes a field facet mirror with a plurality of field facets which are imaged into a superposition plane in such a way that edges of the images of the field facets coincide at least partially in the superposition plane;
and wherein the superposition plane is spaced from the object plane and is not imaged into the object plane.

The advantages thereof are the same as those already described above.

The superposition of the radiation sub-bundles via a field intensity setting device which is arranged in the superposition plane so as to be used as an intensity setting plane and serves for the adjustment of an intensity distribution of the illumination light across the object field, wherein the edges of the superimposed radiation sub-bundles coincide at the point where they are influencable by the field intensity setting device, provides for a virtually illumination-angle-independent effect of the field intensity setting device. In this case, the superposition plane serves as an intensity setting plane. The field intensity setting device influences the superimposed radiation sub-bundles of the illumination light radiation bundle at their point of superposition. Consequently, the field intensity setting device influences all radiation sub-bundles which are superimposed at this point in the same way; in other words, the field intensity setting device has an effect which is independent with respect to these radiation sub-bundles and therefore with respect to the illumination angles which are assigned to these radiation sub-bundles. The superposition of the radiation sub-bundles takes place at least at the point where the field intensity setting device influences the illumination light radiation bundle. In the case of approximately rectangular radiation sub-bundles, for example, a superposition at the edge, which is influenced by the field intensity setting device, is sufficient. Naturally, a superposition of radiation sub-bundles or sub-bundle edge portions may also take place in regions which are not influenced by the field intensity setting device. A superposition of the radiation sub-bundles in the superposition plane or intensity setting plane in order to reduce or virtually avoid an illumination angle impact of the field intensity setting device is, among other things, applicable in systems in which the field intensity setting device is able to influence the superimposed radiation sub-bundles from two sides. These may be illumination optics with an intermediate image or illumination optics with transmission masks. The field intensity setting device defines the intensity of the illumination light in the object plane. A superposition of the radiation sub-bundles at a point, which is in the range of impact of the field intensity setting device, furthermore allows an increased stability of the object field illumination to be achieved since a displacement of a light source used to generate the illumination light will, if at all, only have a minor impact on the effect of the field intensity setting device. This is advantageous in particular when an EUV plasma source is used.

A field intensity setting device which includes a plurality of individual diaphragms or stops that are arranged next to one another and at least attenuate illumination light when exposed thereto and are insertable into an illumination light radiation bundle in a direction parallel to an object displacement direction provides for a sensitive adjustment of the intensity across an object field height of the object field, in other words an object field dimension perpendicular to an object displacement direction.

In some embodiments, the disclosure provides an illumination optics for microlithography configured to achieve an increased number of possible applications of the field intensity setting device.

In certain embodiments, the disclosure provides an illumination optics for microlithography including:

an optical assembly for guiding illumination light to an object field to be illuminated in an object plane;
a field intensity setting device for adjusting an intensity distribution across the object field with a plurality of individual diaphragms which are arranged next to one another and at least attenuate illumination light when exposed thereto and are insertable into an illumination light radiation bundle in a direction parallel to an object displacement direction;

wherein all individual diaphragms of the field intensity setting device are insertable into the illumination light radiation bundle from one and the same side.

It has been found according to the disclosure that if the individual diaphragms of the field intensity setting device are all insertable into the illumination light radiation bundle from one side, the field intensity setting device is even applicable in situations where the object field is arranged on a reflective object such as a reflective reticle. The field intensity setting device may then be arranged in such a way that it does not interfere with the reflected light path of the illumination light radiation bundle.

An arrangement of the field intensity setting device in an intensity setting plane, which coincides with a field plane of the optical assembly, may again ensure an illumination-angle-independent effect of the field intensity setting device. The field plane of the optical assembly describes the plane where the illumination light radiation bundle is constricted due to the bundle-guiding effect of the optical assembly, and where radiation sub-bundles are superimposed if an illumination light radiation bundle is divided into several radiation sub-bundles. The field plane of the optical assembly is usually the plane into which the object-field-forming components of the optical assembly are imaged. In spite of this, the field plane of the optical assembly is generally position-independent of a plane which is imaged by a downstream projection optics of a microlithographic projection exposure apparatus and which is usually referred to as object plane. In all prior-art illumination optics, the field plane of the optical assembly coincides with the object plane. This is not the case in the inventive illumination optics. Here, it is the field intensity setting device which is arranged in the field plane of the optical assembly and not the object, which is usually a reticle, to be imaged. Prior-art field intensity setting devices are usually arranged upstream of a reticle which is arranged in the field plane of the optical assembly, in other words they are not arranged in this field plane. Consequently, the prior-art field intensity setting device has a greater impact on radiation sub-bundles of the illumination light radiation bundle which are assigned to particular illumination angles than on radiation sub-bundles assigned to other illumination angles; the prior-art field intensity setting devices have therefore an undesired illumination-angle-dependent effect across the object field. This problem was recognized by the inventors and eliminated by arranging the field intensity setting device in the field plane of the optical assembly. Surprisingly, this allows the object to be moved out of the field plane of the optical assembly without any problems. This applies in particular if a projection exposure apparatus, which includes the illumination optics, is designed as a scanning apparatus. Moreover, this applies in particular if the illumination of the object field is carried out using a numerical aperture of the illumination light radiation bundle, which is smaller than or equal to 0.1.

An arrangement in which the object plane is adjacent to the intensity setting plane in such a way that there is no pupil plane of the optical assembly between the intensity setting plane and the object plane is particularly compact.

An arrangement in which a distance between the intensity setting plane and the object plane is in the range of between 5 mm and 20 mm prevents spatial conflicts or dosing errors, in other words unwanted aberrations in the illumination intensity entering the object field. Distances can be in the range of between 10 mm and 20 mm, in particular in the range of 15 mm or 16 mm.

An arrangement in which the optical assembly includes a field facet mirror with a plurality of field facets whose images are at least partially superimposed in the object field permits easy control of an illumination angle distribution of the illumination of the object field.

A configuration of the field facets such that the field facets have a higher x/y aspect ratio than the object field, which means that proportionally speaking, they are narrower than the object field when seen in the object displacement direction, may avoid an overexposure of the object field as a result of diverging field facet images in the object plane or in the reticle plane due to the fact that the object is not disposed in the field plane, also referred to as diaphragm plane, of the optical assembly in which the partial fields, in other words the images of object-field-forming components of the optical assembly of the illumination optics, are arranged in such a way that the feedback on the illumination angle distribution is minimized.

An arrangement in which an edge of the illumination light radiation bundle facing the individual diaphragms is illuminated by all field facets of the field facet mirror ensures a relatively homogeneous impact of the field intensity setting device on all field facet images, thus avoiding an unwanted impact on the illumination angle distribution during the use of the field intensity setting device. As long as sharp images of the field facets are produced in the intensity setting plane, this ensures a particularly high system stability, wherein in particular a spatial displacement of a light source of the illumination light is more or less unproblematic. This is advantageous in particular when the light source is an EUV plasma source.

An arrangement in which an edge of the illumination light radiation bundle facing the individual diaphragms is illuminated in the field plane by a subgroup of all field facets of the field facet mirror ensures an illumination-angle-independent effect of the field intensity setting device even if a coincidence of the field facet images at the edge of the illumination light radiation bundle in the field plane facing the individual diaphragms is not achievable for all field facet images.

An assignment of a given distribution of illumination angles to the field facets of the subgroup improves an illumination angle independence of the field intensity setting device in those cases in which a perfect superposition at the edge of the illumination light radiation bundle in the field plane facing the individual diaphragms is not achievable at all or only to a minor extent. The defined distribution of illumination angles may for instance be generated via a statistical function. This not only ensures an illumination angle independence of the intensity setting device but also guarantees a defined impact on the illumination angles.

A pupil facet mirror with a plurality of pupil facets which are assigned to the field facets in the light path of the illumination light permits easy control of an illumination angle distribution across the object field.

Pupil facets which are tiltable for adjusting a superposition of the illumination light in the intensity setting plane allow the individual radiation sub-bundles of the illumination light radiation bundle to be selectively displaced and oriented in the intensity setting plane in order to optimize the subposition of these radiation sub-bundles in a region that is in the range of impact of the field intensity setting device.

Individual diaphragms which are, at least in some portions, at least partially transparent enhance the sensitivity of the intensity effect of the field intensity setting device with respect to a displacement of individual diaphragms and with respect to a change of position of the field intensity setting device relative to illumination light radiation bundle.

When using the illumination optics for guiding EUV illumination light with a wavelength of between 5 nm and 30 nm to the object field, the advantages described above become even more apparent.

In some embodiments, the disclosure provides an illumination optics for microlithography including:
  an optical assembly for guiding illumination light with a wavelength of between 5 nm and 30 nm to an object field to be illuminated in an object plane;
  a field intensity setting device for adjusting an intensity distribution of the illumination light across the object field;
  wherein the field intensity setting device has such an effect on a cross-section, which is formed by the illumination light and is perpendicular to an illumination light radiation bundle, that an edge of the bundle cross-section opposite to the field intensity setting device remains unchanged downstream of the field intensity setting device;
and wherein an effect of the field intensity setting device is independent of an illumination angle on the object field.

The advantages thereof are the same as those already described above.

The advantages of an illumination system which includes an illumination optics according to the disclosure and a light source, of a projection exposure apparatus including an illumination system according to the disclosure and a projection objective for imaging the object field into an image plane, of a method of producing a structured component including the steps of
  providing a wafer to at least part of which is applied a layer of a light-sensitive material;
  providing a reticle which includes structures to be imaged;
  providing a projection exposure apparatus according to the disclosure; and
  projecting at least a part of the reticle onto a region of the layer on the wafer via the projection exposure apparatus,
as well as a component produced in such a way are the same as those described above with reference to the illumination optics. The light source may in particular be an EUV light source with a wavelength of useful light in the range of between 5 nm and 30 nm. The projection exposure apparatus is used for lithographic production of a microstructured or nanostructured component.

BRIEF DESCRIPTION OF THE DRAWINGS

Embodiments of the disclosure will hereinafter be explained in more detail via the drawings, in which.

DETAILED DESCRIPTION

Figure 1:
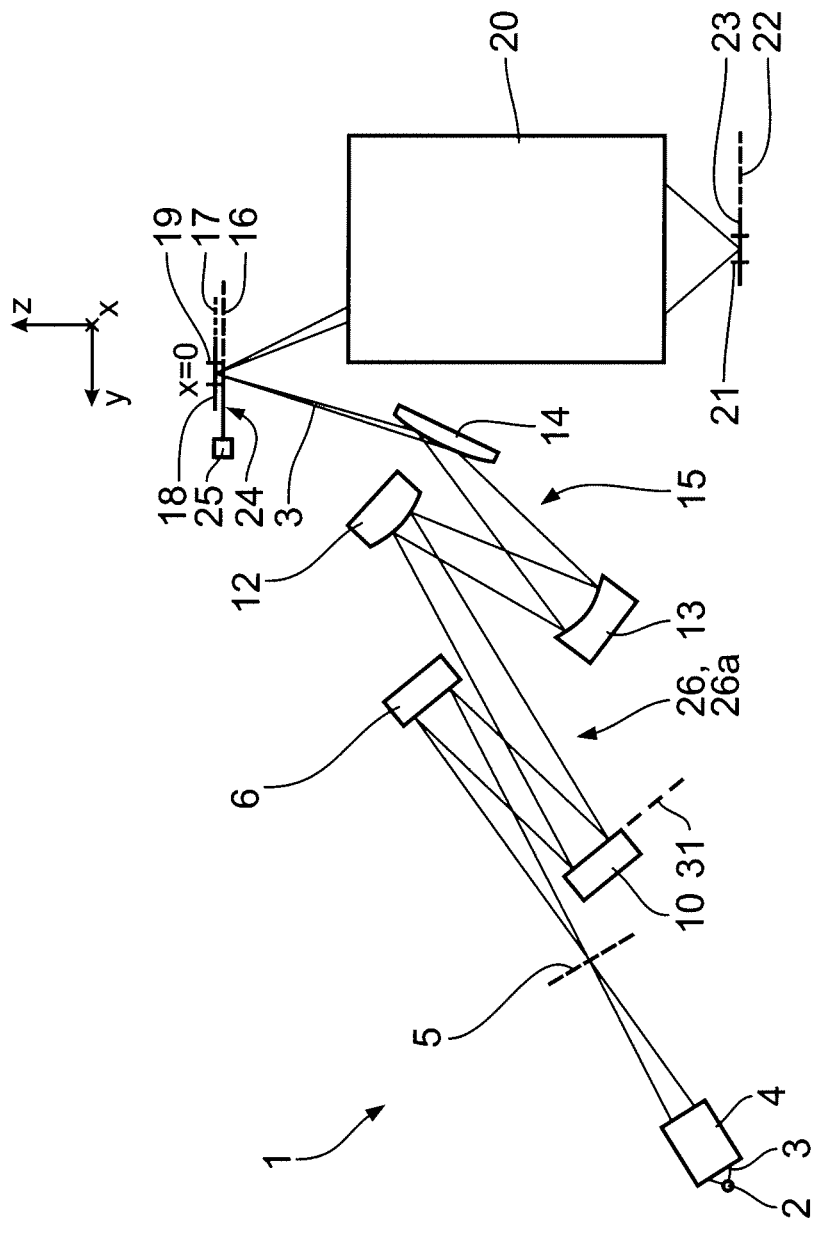
FIG. 1 shows a schematic view of a meridional section, relative to an illumination optics, through a projection exposure apparatus for microlithography.

A projection exposure apparatus 1 for microlithography serves to produce a microstructured or nanostructured electronic semiconductor component. A light source 2 emits EUV radiation in the wavelength range of between 5 nm and 30 nm, for example. In the projection exposure apparatus 1, a bundle 3 of useful radiation serves for illumination and projection. Downstream of the light source 2, the bundle 3 of useful radiation initially passes through a collector 4 which may for example be a nested collector with a prior-art multiple-shell configuration. Downstream of the collector 4, the bundle 3 of useful radiation initially passes through an intermediate focal plane 5 which may be used to separate unwanted portions of radiation or particles from the bundle 3 of useful radiation. Having passed through the intermediate focal plane 5, the bundle 3 of useful radiation initially hits a field facet mirror 6.

The drawing includes in each case an xyz coordinate system in order to facilitate the description of positional relationships. In FIG. 1, the x-axis extends into the plane perpendicular thereto. The y-axis extends towards the left in FIG. 1. The z-axis extends upwardly in FIG. 1.

Figure 4:
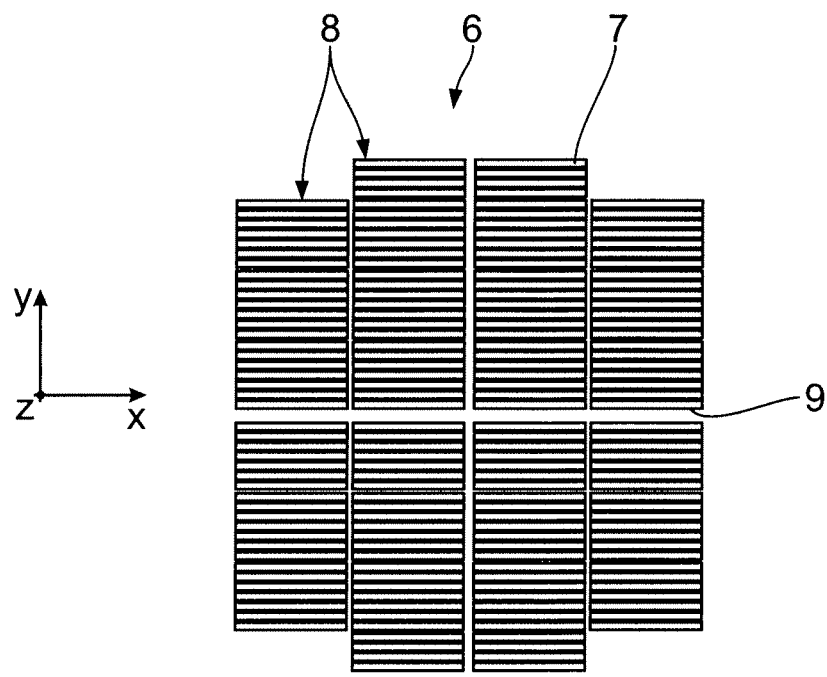
FIG. 4 shows a view of a facet arrangement of a field facet mirror of the illumination optics of the projection exposure apparatus according to FIG. 1.

FIG. 4 shows, by way of example, a facet arrangement of field facets 7 of the field facet mirror 6. The field facets 7 are rectangular and have in each case the same x/y aspect ratio. The field facets 7 define a reflective surface of the field facet mirror 6 and are arranged in four columns of in each case six field facet groups 8. The field facet groups 8 usually include in each case seven field facets 7. The two field facet groups 8 near the edge, which are included in the two central field facet columns, include in each case four additional field facets 7 and therefore include a total of eleven field facets 7. Between the two central facet columns and between the third and fourth facet row, the facet arrangement of the field facet mirror 6 has gaps 9 in which the field facet mirror 6 is shadowed by support spokes of the collector 4.

Having been reflected at the field facet mirror 6, the bundle 3 of useful radiation, which is divided into radiation sub-bundles assigned to the individual facets 7, hits a pupil facet mirror 10.

Figure 5:
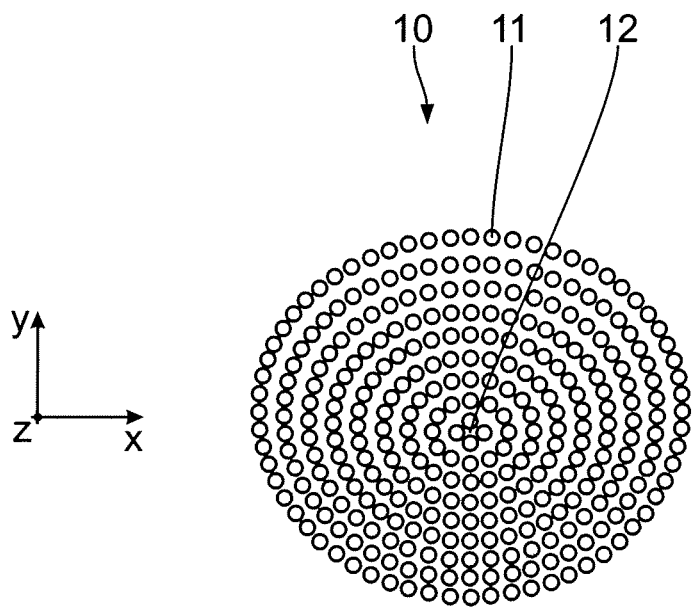
FIG. 5 shows a view of a facet arrangement of a pupil facet mirror of the illumination optics of the projection exposure apparatus according to FIG. 1.

FIG. 5 shows, by way of example, a facet arrangement of round pupil facets 11 of the pupil facet mirror 10. The pupil facets 11 are arranged in facet rings which are arranged one inside the other such as to surround a center 12. Each of the radiation sub-bundles of the bundle 3 of useful radiation, which are reflected by one of the field facets 7, is assigned to a pupil facet 11 in such a way that a respectively exposed pair of facets, which includes one of the field facets 7 and one of the pupil facets 11, defines one radiation guide channel for the assigned radiation bundle of the bundle 3 of useful radiation. The channel assignment between the pupil facets 11 and the field facets 7 takes place in dependence on a desired illumination by way of the projection exposure apparatus 1. In order to give access to particular pupil facets 11, the field facets 7 are individually tilted about the x-axis on the one hand and about the y-axis on the other.

The pupil facet mirror 10 and a downstream transmission optics 15, which includes three EUV mirrors 12, 13, 14, serve to image the field facets 7 into a field plane 16 of the projection exposure apparatus 1. The EUV mirror 14 is a grazing incidence mirror. A reticle plane 17 is disposed downstream of the field plane 16 at a distance of approximately 5 mm to 20 mm when seen in the z-direction, in which reticle plane 17 is arranged a reticle 18 which, via the bundle 3 of useful radiation, illuminates an illumination region which coincides with an object field 19 of a downstream projection optics 20 of the projection exposure apparatus 1. In the projection exposure apparatus 1, the field plane 16, into which the field facets 7 are imaged to form facet images via the transmission optics 15, does not coincide with the reticle plane 17 which simultaneously forms the object plane of the projection optics 20. The bundle 3 of useful radiation is reflected by the reticle 18.

The projection optics 20 images the object field 19 in the reticle plane 17 into an image field 21 in an image plane 22. In this image plane 22 is arranged a wafer 23 which carries a light-sensitive layer that is exposed to light during the projection exposure by way of the projection exposure apparatus 1. During the projection exposure, both the reticle 18 as well as the wafer 23 are scanned in the y-direction in a synchronized manner. The projection exposure apparatus 1 is a scanner. The scanning direction is hereinafter also referred as object displacement direction.

In the field plane 16 is arranged a field intensity setting device 24 which will hereinafter be explained in more detail. The field intensity setting device 24 serves to define a scan-integrated intensity distribution, in other words an intensity distribution which is integrated in the y-direction, across the object field 19. Therefore, the field plane 16 is at the same time an intensity setting plane of the illumination optics 26. The field intensity setting device 24 is actuated by a control device 25.

The field facet mirror 6, the pupil facet mirror 10, the mirrors 12 to 14 of the transmission optics 15, as well as the field intensity setting device 24 are components of an illumination optics 26 of the projection exposure apparatus 1. The components 6, 10, 12, 13 and 14 form an optical assembly 26a of the illumination optics 26 for guiding the bundle 3 of useful radiation.

There is no pupil plane of the optical assembly 26a between the field plane 16 and the reticle plane 17.

Figure 2:
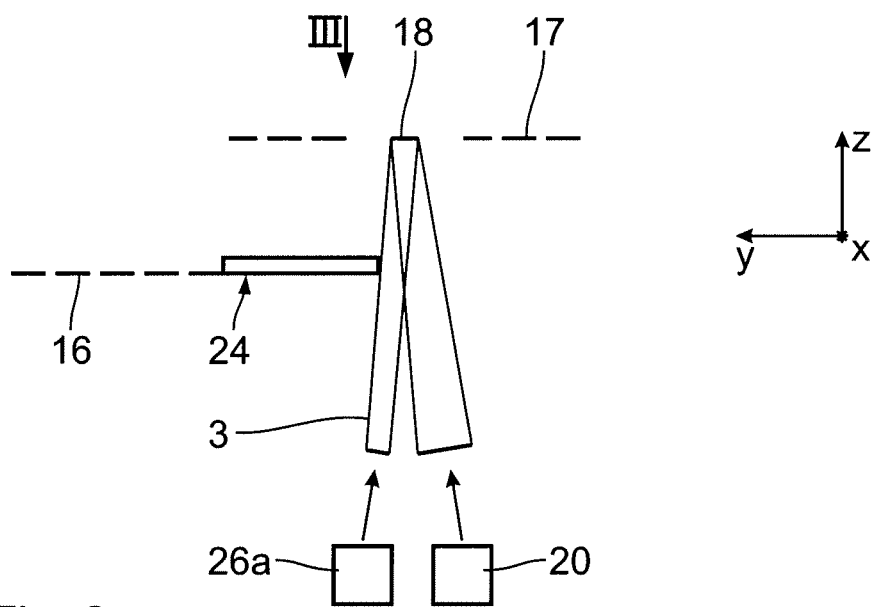
FIG. 2 shows an enlarged sectional view of FIG. 1 in the vicinity of a reticle plane.
Figure 3:
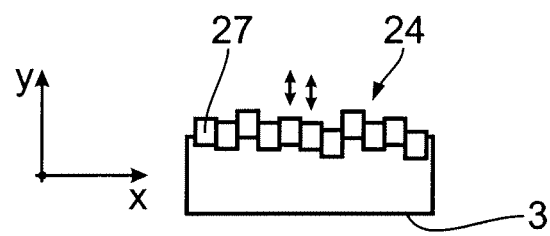
FIG. 3 shows a view of a field intensity setting device of the projection exposure apparatus from direction III in FIG. 2.

FIGS. 2 and 3 show a more detailed illustration of the field intensity setting device 24. The field intensity setting device 24 has a plurality of finger-like individual diaphragms 27 which are arranged next to one another. In the embodiment according to FIGS. 2 and 3, there are a total of twenty-six individual diaphragms 27 with a width of in each case 4 mm. These individual diaphragms 27 are either arranged directly next to one another or partially overlap with each other. If they partially overlap with each other, neighbors of the individual diaphragms 27 need to be disposed perpendicular to the beam direction of the illumination light radiation bundle 3 in planes which are as close as possible to each other.

All individual diaphragms 27 are inserted into the bundle 3 of useful radiation from one and the same side.

The control device 25 allows the individual diaphragms 27 to be placed independently of each other at a given position along the y-direction. Depending on the field height, in other words the x-direction, of an object point on the reticle 18 passing through the object field 19, the scanning path of this object point in the y-direction, and therefore the integrated intensity of the useful radiation to which this object point is exposed, is determined by the y-position of the respective individual diaphragm 27. In this way, the intensity of useful radiation to which the reticle 18 is exposed may be homogenized or distributed in a given way by defining the y-positions of the individual diaphragms 27. The field intensity setting device 24 is also referred to as UNICOM.

Figure 6:
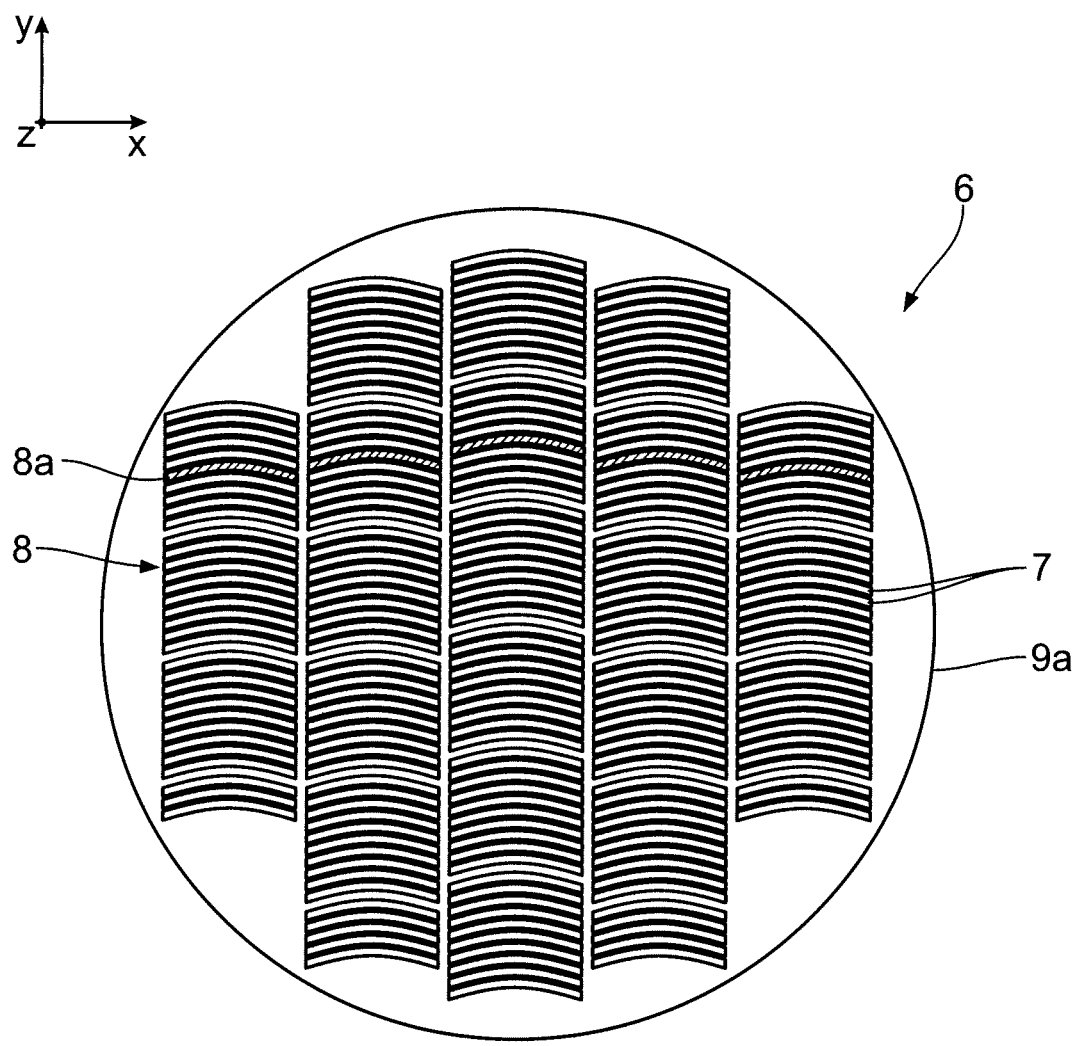
FIG. 6 shows an illustration, similar to FIG. 4, of a facet arrangement of another embodiment of a field facet mirror.

FIG. 6 shows another embodiment of a field facet mirror 6. Components which are equivalent to those explained above with reference to the field facet mirror according to FIG. 4 have the same reference numerals and are only described if they differ from the components of the field facet mirror 6 according to FIG. 4. The field facet mirror according to FIG. 6 has a field facet arrangement with curved field facets 7. These field facets 7 are arranged in a total of five columns with in each case a plurality of field facet groups 8. The field facet arrangement is inscribed in a circular boundary of a carrier plate 9a of the field facet mirror.

The field facets 7 of the embodiment according to FIG. 6 have in each case the same surface area and the same ratio of width (in x-direction) to height (in y-direction), which corresponds to the x/y aspect ratio of the field facets 7 of the embodiment according to FIG. 4.

The field intensity setting device 24 has an intensity effect which has virtually no impact on an illumination angle distribution of the object field 19. This will hereinafter be explained with reference to FIG. 7. The Figure schematically illustrates the path of three radiation sub-bundles 28, 29 and 30 from a pupil plane 31, in which is arranged the pupil facet mirror 10, across the field plane 16 up to the reticle plane 17. The planes 31, 16 and 17, which are in practice arranged in succession in the light path of the three radiation sub-bundles 28, 29 and 30, are shown next to one another in FIG. 7 for illustrative purposes. The following is based on the idealized assumption that the field facets 7 of the field facet mirror 6 according to FIG. 4 are imaged into the field plane 16 in such a way as to coincide perfectly. An edge boundary of the bundle 3 of useful radiation in the field plane 16 therefore has the same extension in both the x-direction and the y-direction as a single image of one of the field facets 7. Consequently, in the event of such a perfect superposition, the bundle 3 of useful radiation has an x/y aspect ratio which is perfectly equal to the x/y aspect ratio of the field facets 7. All radiation sub-bundles 28, which are assigned to different illumination directions of the field plane 16 and therefore include the radiation sub-bundles 28 to 30 as well, coincide in the field plane 16 across their entire cross-section. In particular an edge 32 of the bundle 3 of useful radiation facing the individual diaphragms 27 is formed and illuminated by all of the three radiation sub-bundles 28 to 30 at the same time. Consequently, the individual diaphragms 27, which cover the bundle 3 of useful radiation from the edge 32, have exactly the same, in other words an illumination-angle-independent, intensity effect on all radiation sub-bundles 28 to 30. For the radiation sub-bundles 28 to 30, this is schematically indicated in the pupil plane 31 on the right-hand side of FIG. 7 by rectangular shadows which are active on one side. These shadows in the pupil plane 31 do not constitute real diaphragms.

The field facet images in the field facet plane 16 need not coincide perfectly in the x-direction, in other words perpendicular to the scanning direction, for the field intensity setting device 24 to have an illumination-angle-independent effect according to the above description; in fact, the field facet images may very well be arranged at a certain offset with respect to each other. If the field facet images in the field facet plane 16 coincide well even in the x-direction, this may be used for intensity detection by decoupling useful radiation.

In the reticle plane 17, which is arranged in the light path of the bundle 3 of useful radiation at for instance 20 mm behind the field plane 16 when seen in the z-direction, the three radiation sub-bundles 28 to 30 have slightly diverged in particular in the y-direction in such a way that for instance the radiation sub-bundle 28 slightly projects upwardly in the y-direction and beyond the radiation sub-bundle 29 in the center of the object field 19, while the radiation sub-bundle 30 slightly projects beyond the radiation sub-bundle 29 downwardly in the y-direction. As the reticle is scanned by the object field 19 in the y-direction, the reticle sees scan-integrated all of the three radiation sub-bundles 28 to 30 to their full extent; consequently, the mentioned y-offset between the respective radiation sub-bundles 28 to 30 in the reticle plane 17 does not have any negative effects.

Compared to a given x/y aspect ratio of the field facets 7, the x/y aspect ratio of the object field 19 is smaller due to the above-described y-offset of the radiation sub-bundles 28 to 30.

Figure 8:
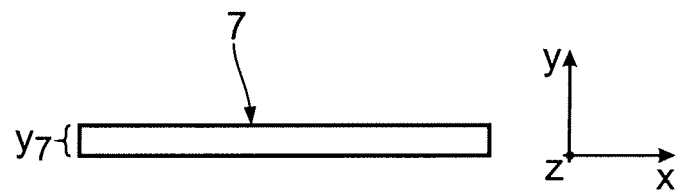
FIG. 8 shows a field facet of an embodiment of the field facet mirror according to FIG. 4.
Figure 9:
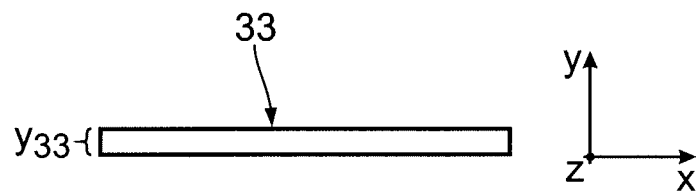
FIG. 9 shows a field facet of another embodiment of the field facet mirror according to FIG. 4.

FIG. 8 shows a rectangular field facet 7 of the field facet mirror 6 according to FIG. 4 with an x/y aspect ratio which corresponds to a given x/y aspect ratio in the field plane 16. If the given x/y aspect ratio is not to be generated in the field plane 16 but in the reticle plane 17, a field facet mirror 6 needs to be used which includes field facets 33 whose x/y aspect ratio is greater than the x/y aspect ratio of the object field 19. Therefore, a field facet mirror 6 needs to be used in practice whose field facets 33 are narrower in the y-direction (cf. FIG. 9). A y-extension $y_{33}$ of the field facets is thus smaller than a y-extension $y_7$ of the field facets 7.

Figure 7:
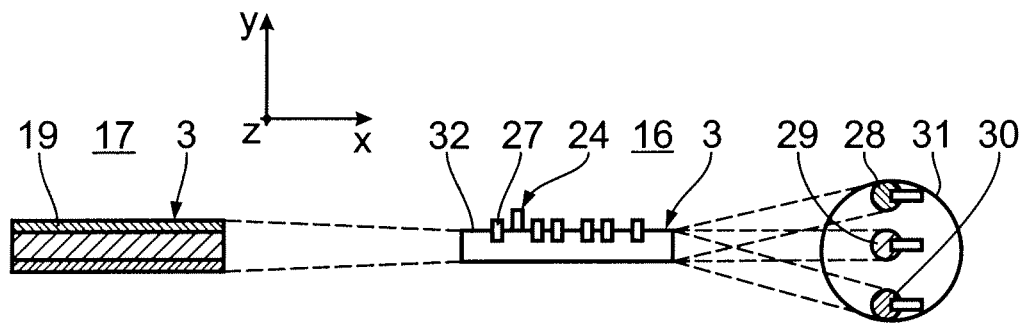
FIG. 7 shows a schematic view of a light path through the illumination optics between a pupil plane of the illumination optics and a reticle plane for three selected radiation sub-bundles which are assigned to in each case particular illumination angles.

In practice, the superposition in the field plane 16 of the radiation sub-bundles, which are assigned to the individual channels, deviates from the perfect superposition shown in FIG. 7 due to a plurality of imaging effects. This may have numerous causes.

First of all, a mutual shadowing of the field facets 7 caused by the illumination geometry of the field facet mirror 10 may result in individually formed images of the field facets 7 in the field plane 16.

Furthermore, the transmission optics 15 may have different imaging scales for different channels, in other words for different radiation sub-bundles, depending on the respectively observed radiation bundle. Likewise, these different imaging scales also result in a superposition of the radiation bundle in the field plane 16 which deviates from the perfect superposition.

Depending on the respective inclination of the field facets 7, a facet projection with an individual facet size is obtained perpendicular to the direction of exposure with the bundle 3 of useful radiation. This has an impact on the superposition in the field plane 16 as well.

Another reason for an imperfect superposition in the field plane 16 lies in that due to the grazing incidence mirror 14, the radiation sub-bundles to be superimposed in the field plane 16 may have different curvatures.

Figure 10:
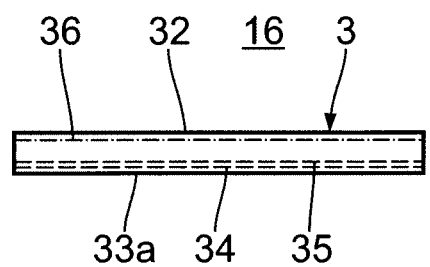
FIG. 10 shows a superposition of three radiation sub-bundles, which are assigned to different illumination angles according to the illustration of FIG. 7, in a plane of the field intensity setting device at an alternative illumination setting.

In case the superposition in the field plane 16 is not perfect, the illumination optics 26 is therefore adjusted in such a way that the individual radiation sub-bundles, which image the respective field facets 7, coincide in the best possible way in the region of the edge 32 facing the individual diaphragms 27. This is schematically illustrated in FIG. 10. An imperfect superposition of the radiation sub-bundles at an edge 33a opposite to the edge 33 is acceptable, as it is indicated by the boundaries 34, 35 of individual radiation sub-bundles which deviate from each other in the y-direction.

In the worst case, a perfect superposition of the radiation sub-bundles is not even achievable at least at the edge 32 facing the individual diaphragms 27. This is the case if the radiation sub-bundles, which coincide at the edge 32, have for instance differently curved edges. In this case, the illumination optics needs to be adjusted by tilting in particular the pupil facets 11 in such a way as to minimize the impact of the field intensity setting device 24 on the illumination angles.

This will hereinafter be explained with reference to FIGS. 11 to 22. FIGS. 11 to 16 show illumination parameters in the object field 19 in the event of a non-optimized superposition of the radiation sub-bundles which is generated by the illumination optics 26, while FIGS. 17 to 22 show the same illumination parameters in the event of a correspondingly optimized superposition of the radiation sub-bundles.

The optical illumination parameters which are discussed below are telecentricity values tx, ty, which are variations of an initial value with an ineffective field intensity setting device ($I_{rel}=1$), as well as corresponding variations $\Delta E$ of ellipticity values as well as the maximum values $\max(\Delta t)$, $\max(\Delta E)$ thereof occurring on the object field 19.

tx and ty are defined as follows:

In each field point of the illumination object field 19 is defined a centroid beam of a light bundle which is assigned to this field point. The centroid beam has the energy-weighted direction of the light bundle which is emitted by this field point. In the ideal case, the centroid beam of each field point is parallel to the principal beam defined by the illumination optics 26 or the projection optics 20.

The direction of the centroid beam $\vec{s}_0(x, y)$ is known due to the design data of the illumination optics 26 or the projection optics 20. The principal beam at a field point is defined by the connection line between the field point and the center of the entrance pupil of the projection optics 20. The direction of the centroid beam at a field point x, y in the object field 19 is obtained as follows:

$$\vec{s}(x, y) = \frac{1}{\tilde{E}(x, y)} \int du\, dv \binom{u}{v} E(u, v, x, y)$$

E(u, v, x, y) is the energy distribution for the field point x, y as a function of the pupil coordinates u, v, in other words as a function of the illumination angle seen by the respective field point x, y.

$\tilde{E}(x,y) = \int du\, dv\, E(u,v,x,y)$ is the total energy to which the point x, y is exposed.

For instance, a central object field point $x_0$, $y_0$ sees the radiation of partial radiation sub-bundles from directions u, v which are defined by the position of the respective pupil facets 11. At this illumination setting, the centroid beam s extends along the principal beam only if the different energies or intensities, respectively, of the partial radiation sub-bundles, which are assigned to the pupil facets 11, combine to form a centroid beam direction which is integrated over all pupil facets 11 and which is parallel to the principal beam direction. This can be achieved only at ideal circumstances. In practice, there is a deviation between the centroid beam directions $\vec{s}(x, y)$ and the principal beam direction $\vec{s}_0(x, y)$ which is referred to as telecentricity error $\vec{t}(x, y)$:

$$\vec{t}(x,y) = \vec{s}(x,y) - \vec{s}_0(x,y)$$

In the practical use of the projection exposure apparatus 1, it is not the static telecentricity error at a particular object field that is to be corrected but the scan-integrated telecentricity error at $x=x_0$. This telecentricity error is obtained as follows:

$$\vec{T}(x_0) = \frac{\int dy\, \tilde{E}(x_0, y)\vec{t}(x_0, y)}{\int dy\, \tilde{E}(x_0, y)}$$

As a result, the telecentricity error is corrected which is integrated by a point (x, e.g. $x_0$) on a reticle 18 moving through the object field in the reticle plane 17 during a scanning process, wherein a difference is made between an x-telecentricity error (Tx) and a y-telecentricity error (Ty). The y-telecentricity error is defined as deviation of the centroid beam from the principal beam perpendicular to the scanning direction. The x-telecentricity error is defined as the deviation of the centroid beam from the principal beam in the scanning direction.

The ellipticity is another parameter for determining the quality of illumination of the object field 19 in the reticle plane 17. The determination of the ellipticity helps to obtain more precise information with regard to the distribution of energy or intensity, respectively, across the entrance pupil of the projection optics 20. To this end, the entrance pupil is divided into eight octants which are numbered in an anti-clockwise direction from $O_1$ to $O_8$, as it is common practice in mathematics. The contribution of energy or intensity, respectively, delivered by the octants $O_1$ to $O_8$ of the entrance pupil for illuminating a field point is hereinafter referred to as energy or intensity contribution, respectively, $I_1$ to $I_8$.

The following quantity is referred to as −45°/45°-ellipticity (Elly, $E_{-45°/+45°}$, $E_{45}$):

$$E_{-45/45} = \frac{I_1 + I_2 + I_5 + I_6}{I_3 + I_4 + I_7 + I_8}.$$

The following quantity is referred to as 0°/90°-ellipticity (Ellx, $E_{0°/90°}$, $E_{90}$):

$$E_{0/90} = \frac{I_1 + I_8 + I_4 + I_5}{I_2 + I_3 + I_6 + I_7}.$$

Likewise, the ellipticity for a particular object field point $x_0$, $y_0$ or even for a scan-integrated illumination ($x=x_0$, y-integrated) may also be determined according to the above description regarding the telecentricity error.

Figure 11:
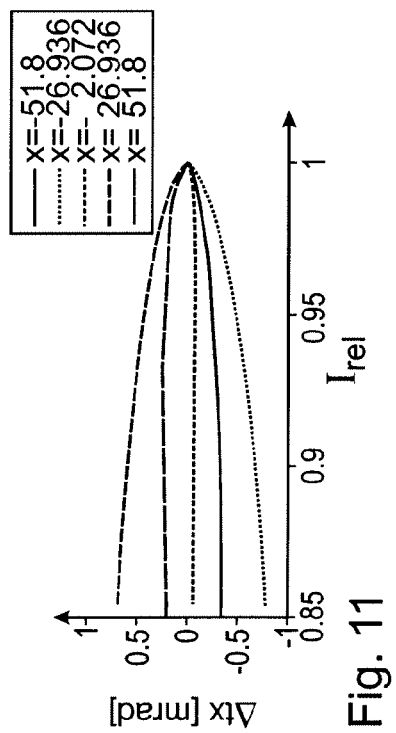
FIGS. 11 to 16 show diagrams for illumination parameters of the illumination of a reticle as a function of an attenuation (in percent) by the field intensity setting device at a first illumination geometry.

FIG. 11 shows the deviation of an x-telecentricity from an initial value for five different field heights as a function of the amount of intensity which is allowed to pass through by the assigned individual diaphragm 27 at this field height. At an attenuation of 15%, in other words at a transmission rate of 0.85, there are telecentricity deviations $\Delta tx$ in particular at the field edge of approximately +/−0.75 mrad (cf. FIG. 11) and of $\Delta ty$ of approximately −2.4 mrad (cf. FIG. 14). Depending on the field height, an ellipticity variation $\Delta E90$ at a transmission rate of 0.85 varies between 2.5% and −1% compared to a non-attenuated value (cf. FIG. 12).

Figure 15:
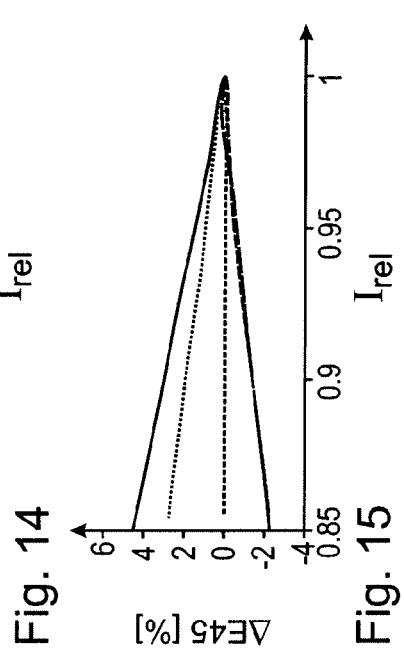

At a transmission rate of 0.85, the value $\Delta E45$ reaches a maximum value of −2% or approximately 4.5%, respectively (cf. FIG. 15).

Figure 13:
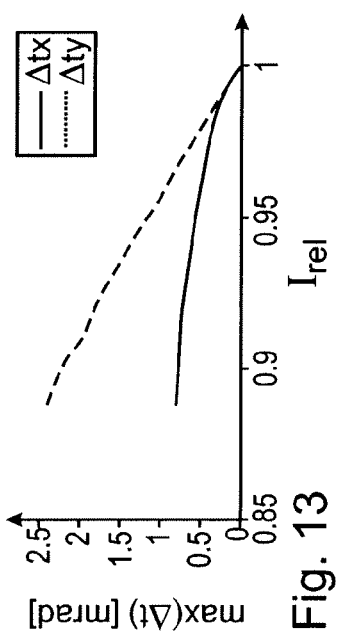
Figure 14:
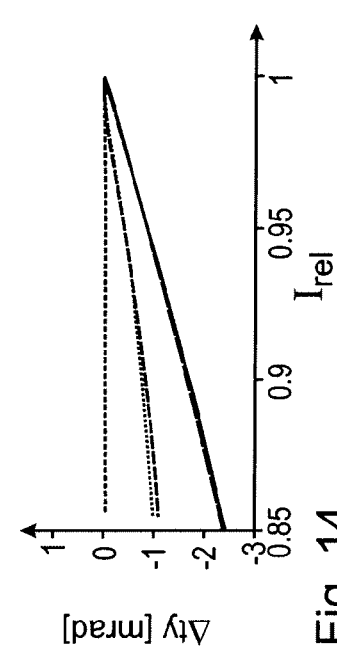

A maximum telecentricity variation reaches a value of 2.5% (cf. FIG. 13).

Figure 16:
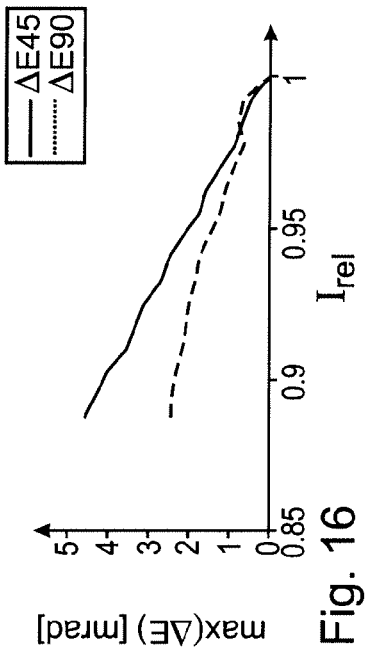
Figure 17:
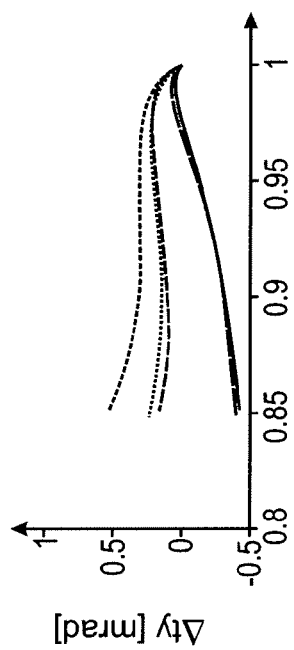
FIGS. 17 to 22 show diagrams for the same illumination parameters at another illumination geometry which is optimized to minimize the change of these illumination parameters which is caused by the attenuation of the field intensity setting device.
Figure 18:
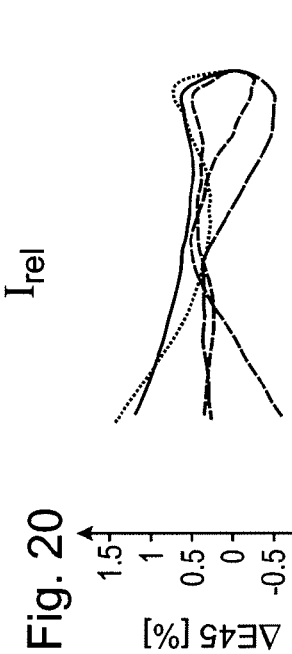
Figure 19:
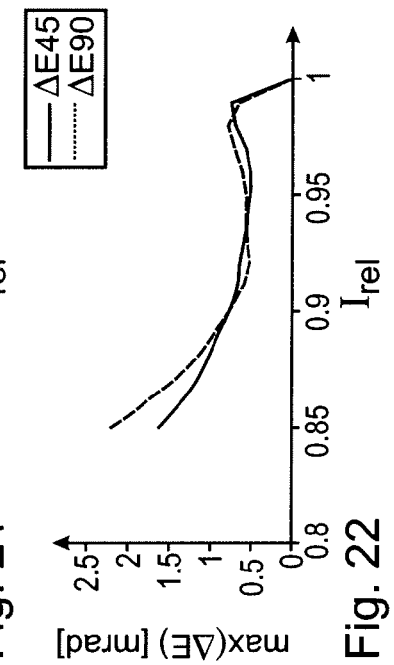
Figure 20:
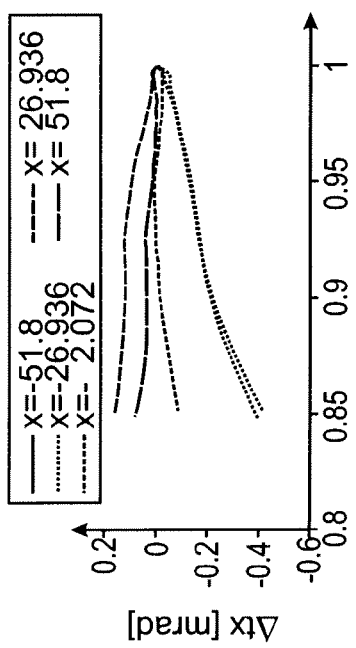
Figure 21:
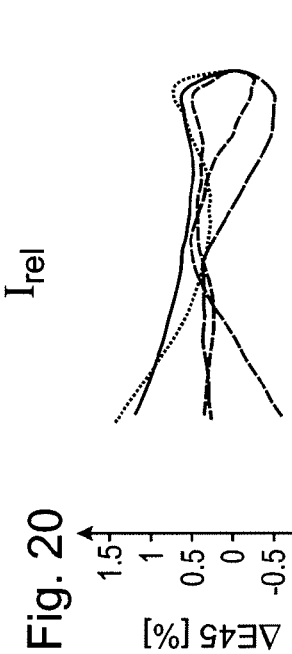
Figure 22:
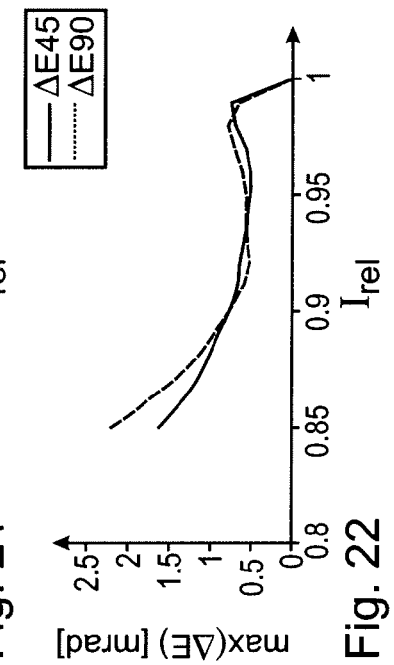

A maximum ellipticity variation $\max(\Delta E)$ reaches values in the range of 4.5% (cf. FIG. 16).

FIGS. 17 to 22 clearly show the impact of the optimized superposition on the radiation sub-bundles in the region of the edge 32 in the field plane 16. A maximum telecentricity variation rate of 0.5 is not exceeded at any field height (cf. FIG. 19). Likewise, a maximum ellipticity variation rate of 2% is not exceeded at any field height either (cf. FIG. 22). These maximum variations apply for an attenuation up to a transmission rate of 0.85. If the attenuation reaches a transmission rate of 0.9, the telecentricity variation does not exceed a value of 0.4 mrad and the ellipticity variation does not exceed a value of 1%.

In an alternative embodiment of coinciding radiation sub-bundles in the field plane 16, the edge 32 facing the individual diaphragms 27 of the field intensity setting device 24 is not illuminated by all field facets 7 but by a subgroup of the field facets 7. This subgroup of the field facets 7 is selected in such a way that the field facets 7 of the subgroup represent all illumination angles, which are achieved at a given illumination via the illumination optics 26, in an optionally equally distributed manner. The subgroup of field facets 7 may for instance be formed by in each case one field facet 7 from the field facet group 8. The subgroup may in each case include the central field facet mirror 6 or one of the two central field facet mirrors 6 of the respective field facet group 8. By way of example, field facets 7 serving as the selected field facets 8a in the field facet mirror 6 according to FIG. 6 are indicated by hatched lines. The respective field facet, which is selected for the subgroup, may for instance be slightly wider in the y-direction than the remaining field facets 7 of the field facet group 8. For example, the subgroup field facet may be a field facet 7 according to FIG. 8 and the other field facets 7 of the field facet group 8 may be field facets 7 according to FIG. 9. A subgroup selection may also be achieved by an individual guidance of radiation sub-bundles for the channels which are formed by the field facets 7 of the field facet subgroup; to this end, the pupil facets 11 are tilted correspondingly. A region between the edge 32 and a boundary 36 within the bundle 3 of useful radiation is only illuminated by the field facets 7 of the field facet subgroup (cf. FIG. 10). Seen from the edge 32, the radiation sub-bundles of all other channels are disposed beyond the boundary 36. The field facets 7 of the subgroup are selected in such a way as to ensure that the radiation sub-bundles thereof coincide in the best possible way in the field plane 16 near the edge 32. The individual diaphragms 27 only have an impact on the intensities of the radiation sub-bundles which are associated with these field facets 7 of the subgroup. As the channels, which are associated with these field facets 7 of the subgroup, are equally distributed across the pupil facet mirror 10, this alternative embodiment of the coinciding radiation sub-bundles in the field plane 16 also guarantees an illumination-angle-independent effect of the field intensity setting device 24.

The individual diaphragms 27 may at least in some portions be semi-permeable and/or transparent, thus allowing for a selective setting. Adjacent individual diaphragms 27 may partially overlap with each other in the x-direction. In particular in this case, it is advantageous for the individual diaphragms 27 to have a variable transmission across their extension.

Transmission distributions which are applicable for the individual diaphragms 27 are for example described in WO 2005/040927 A2.

Instead of finger diaphragms, other embodiments of field intensity setting devices acting in a plane are applicable as well. Examples thereof are described in EP 1 291 721 A1.

Figure 12:
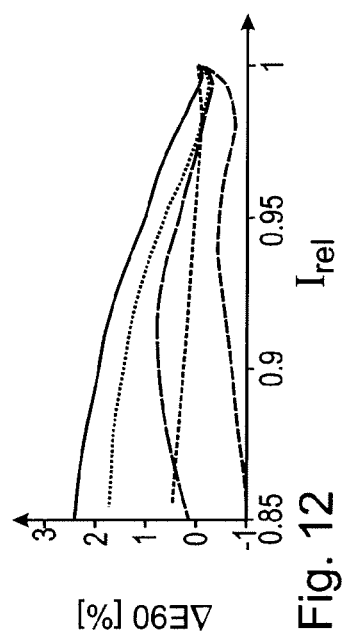

The individual diaphragms 27 may have a structured end side, as it is for example explained in US 2006/0244941 A1, in particular in FIGS. 10 to 12.

What is claimed is:

1. An illumination optics, comprising:
   an optical assembly configured to guide illumination light to an object field in an object plane,
   wherein:
      the illumination optics is configured to divide an illumination light radiation bundle into a plurality of radiation sub-bundles which are assigned to different illumination angles of the object field;
      the illumination optics is configured so that at least some of the radiation sub-bundles are superimposed in a superposition plane;
      the superposition plane is spaced from the object plane;
      the superposition plane is not imaged into the object plane;
      in the superposition plane, each radiation sub-bundle has a cross-section with an outer edge which extends between two points on an outer perimeter of the cross-section of the radiation sub-bundle;
      in the superposition plane, the outer edge of at least one radiation sub-bundle entirely coincides with the outer edge of another radiation sub-bundle; and
      the illumination optics is configured to be used in microlithography.

2. An illumination optics, comprising:
   an optical assembly configured to guide illumination light to an object field in an object plane, the illumination optics comprising a field facet mirror including a plurality of field facets, wherein during use of the illumination optics each field facet is imaged into a superposition plane via an optical element so that edges of the images of the field facets at least partially coincide in the superposition plane,
   wherein:
      the superposition plane is spaced from the object plane;
      the superposition plane is not imaged into the object plane; and
      the illumination optics is configured to be used in microlithography.

3. An illumination optics according to claim 1, further comprising a field intensity setting device disposed in the superposition plane,
   wherein:
      the field intensity setting device is configured to adjust an intensity distribution of the illumination light across the object field; and
      in the superposition plane, the edges of the superimposed radiation sub-bundles coincide at a point where they are influencable by the field intensity setting device.

4. An illumination optics according to claim 3, wherein the intensity setting device comprises a plurality of individual diaphragms arranged next to one another so that they at least attenuate illumination light exposed thereon and so that they are insertable into the illumination light radiation bundle in a direction parallel to an object displacement direction.

5. An illumination optics, comprising:
   an optical assembly configured to guide illumination light to an object field in an object plane;
   a field intensity setting device configured to adjust an intensity distribution across the object field, the field intensity device comprising a plurality of individual diaphragms arranged next to one another so that they at least attenuate illumination light exposed thereon and so that they are insertable into an illumination light radiation bundle in a direction parallel to an object displacement direction,
   wherein:
      the plurality of individual diaphragms comprises a first diaphragm and a second diaphram;
      the first diaphram is configured to attenuate intensity at a first portion of the illumination light;
      the second diaphram is configured to attenuate intensity at a second portion of the illumination light independent of the attenuation of intensity at the first portion by the first diaphram;
      the first portion is located relative to the second portion in a direction perpendicular to the object displacement direction;

all individual diaphragms of the field intensity setting device are insertable into the illumination light radiation bundle from the same side of the illumination light radiation bundle; and the illumination optics is a catoptric microlithography illumination optics.

6. An illumination optics according to claim 3, wherein the field intensity setting device is disposed in an intensity setting plane which coincides with a field plane of the optical assembly.

7. An illumination optics according to claim 6, wherein there is no pupil plane of the optical assembly between the intensity setting plane and the object plane.

8. An illumination optics according to claim 7, wherein a distance between the intensity setting plane and the object plane is between 5 mm and 20 mm.

9. An illumination optics according to claim 1, wherein the plurality of mirrors of the optical assembly comprises a field facet mirror with a plurality of field facets whose images are at least partially superimposed in the object field.

10. An illumination optics according to claim 9, wherein the field facets have a higher aspect ratio than the object field.

11. An illumination optics according to claim 9, wherein the intensity setting device comprises a plurality of individual diaphragms, and an edge of the illumination light radiation bundle facing the individual diaphragms is illuminated in the field plane by all field facets of the field facet mirror.

12. An illumination optics according to claim 9, wherein the intensity setting device comprises a plurality of individual diaphragms, and edge of the illumination light radiation bundle facing the individual diaphragms is illuminated in the field plane by a subgroup of all field facets of the field facet mirror.

13. An illumination optics according to claim 12, wherein a distribution of illumination angles is assigned to the field facets of the subgroup.

14. An illumination optics according to claim 9, wherein the plurality of mirrors of the optical assembly comprises a pupil facet mirror including a plurality of pupil facets assigned to the field facets in the light path of the illumination light.

15. An illumination optics according to claim 14, wherein the pupil facets are tiltable to adjust a superposition of the illumination light in superposition plane.

16. An illumination optics according to claim 4, wherein at least portions of the individual diaphragms are at least partially transparent.

17. An illumination optics according to claim 1, wherein the illumination optics is configured to be used with illumination light having a wavelength of between 5 nm and 30 nm.

18. An illumination optics, comprising:
an optical assembly configured to guide illumination light with a wavelength of between 5 nm and 30 nm to an object field in an object plane; and
a field intensity setting device configured to adjust an intensity distribution of the illumination light across the object field,
wherein:
the field intensity setting device is configured so that, on a cross-section formed by the illumination light perpendicular to an illumination light radiation bundle, an edge of the bundle cross-section opposite to the field intensity setting device remains unchanged downstream of the field intensity setting device;
an effect of the field intensity setting device is independent of an illumination angle on the object field; and the illumination optics is configured to be used in microlithography.

19. An apparatus, comprising:
an illumination system comprising an illumination optics according to claim 1; and
a projection objective configured to image the object field into an image plane,
wherein the apparatus is aprojection exposure apparatus.

20. A method, comprising:
using an a projection exposure apparatus to manufacture structured components, the projection exposure apparatus comprising:
an illumination system comprising an illumination optics according to claim 1; and
a projection objective configured to image the object field into an image plane.

21. An illumination optics according to claim 1, wherein the superposition plane is upstream of the object plane.

22. An illumination optics according to claim 2, wherein the superposition plane is upstream of the object plane.

23. An illumination optics according to claim 1, wherein the outer perimeter of at least one radiation sub-bundle entirely coincides with the outer perimeter of another radiation sub-bundle.

24. An illumination optics according to claim 2, wherein:
the plurality of field facets comprises a first field facet;
the first field facet has a height in a direction parallel to an object displacement direction and a width in a direction perpendicular to the object displacement direction;
the object field facet has an height in the direction parallel to the object displacement direction and a width in the direction perpendicular to the object displacement direction;
a ratio of the width to the height of the first field facet is larger than the ratio of the width to the height of the object field.

25. An illumination optics according to claim 2, further comprising a field intensity setting device disposed in the superposition plane, wherein the field intensity setting device is configured to adjust an intensity distribution of the illumination light across the object field.

26. An illumination optics according to claim 25, wherein the field intensity setting device comprises a plurality of individual diaphragms arranged next to one another so that they at least attenuate illumination light exposed thereon and so that they are insertable into an illumination light radiation bundle in the direction parallel to an object displacement direction.

27. An illumination optics according to claim 5, wherein:
the field intensity setting device is diposed in a plane;
the plane is not imaged into the object plane; and
an effect of the field intensity setting device is independent of an illumination angle on the object field.

28. An illumination optics according to claim 2, wherein the optical element comprises a mirror.

29. An illumination optics according to claim 2, wherein the optical element comprises a pupil facet mirror.

30. An illumination optics according to claim 2, wherein the optical element comprises a first mirror, the illumination optics further comprises second and third mirrors, and each field facet is imaged into a superposition plane via the first, second and third mirrors so that edges of the images of the field facets at least partially coincide in the superposition plane.

* * * * *

UNITED STATES PATENT AND TRADEMARK OFFICE
CERTIFICATE OF CORRECTION

| | | |
|---|---|---|
| PATENT NO. | : 8,937,708 B2 | Page 1 of 1 |
| APPLICATION NO. | : 12/789772 | |
| DATED | : January 20, 2015 | |
| INVENTOR(S) | : Martin Endres et al. | |

It is certified that error appears in the above-identified patent and that said Letters Patent is hereby corrected as shown below:

In the Claims

Col. 14, line 58, Claim 5, delete "diaphram;" and insert -- diaphragm; --.

Col. 14, line 59, Claim 5, delete "diaphram" and insert -- diaphragm --.

Col. 14, line 61, Claim 5, delete "diaphram" and insert -- diaphragm --.

Col. 14, line 64, Claim 5, delete "diaphram;" and insert -- diaphragm; --.

Col. 16, line 10, Claim 20, delete "an a" and insert -- a --.

Col. 16, line 51, Claim 27, delete "diposed" and insert -- disposed --.

Signed and Sealed this
Sixteenth Day of June, 2015

Michelle K. Lee
*Director of the United States Patent and Trademark Office*